United States Patent
Tu et al.

(10) Patent No.: US 8,766,653 B2
(45) Date of Patent: Jul. 1, 2014

(54) MEASURING DEVICE FOR MEASURING INSULATION RESISTANCE OF AN ELECTRIC VEHICLE

(75) Inventors: Chia-Cheng Tu, Lugong (TW); Jia-Sing Hsu, Lugong (TW)

(73) Assignee: Automotive Research & Testing Center, Lugong, Changhua County (TW)

( * ) Notice: Subject to any disclaimer, the term of this patent is extended or adjusted under 35 U.S.C. 154(b) by 777 days.

(21) Appl. No.: 13/048,146

(22) Filed: Mar. 15, 2011

(65) Prior Publication Data

US 2012/0235824 A1    Sep. 20, 2012

(51) Int. Cl.
| | |
|---|---|
| *G01R 27/08* | (2006.01) |
| *G01R 27/18* | (2006.01) |
| *G01R 31/00* | (2006.01) |
| *G01R 31/02* | (2006.01) |
| *G01R 31/36* | (2006.01) |
| *G01R 31/14* | (2006.01) |

(52) U.S. Cl.
CPC ............... *G01R 27/08* (2013.01); *G01R 27/18* (2013.01); *G01R 31/006* (2013.01); *G01R 31/025* (2013.01); *G01R 31/36* (2013.01); *G01R 31/005* (2013.01); *G01R 31/14* (2013.01)
USPC ........... 324/691; 324/549; 324/555; 324/522; 324/713

(58) Field of Classification Search
CPC .... G01R 27/18; G01R 31/006; G01R 31/025; G01R 27/08; G01R 31/36; G01R 31/005; G01R 31/14
USPC ............................ 324/691, 549, 555, 522, 713
See application file for complete search history.

(56) References Cited

U.S. PATENT DOCUMENTS

| | | | | |
|---|---|---|---|---|
| 5,612,623 | A * | 3/1997 | Watanabe et al. | 324/549 |
| 6,731,116 | B2 * | 5/2004 | Yamamoto et al. | 324/522 |
| 7,592,815 | B2 * | 9/2009 | Yano | 324/509 |
| 7,944,199 | B2 * | 5/2011 | Wynne | 324/126 |
| 7,973,543 | B2 * | 7/2011 | Andoh et al. | 324/713 |
| 8,106,667 | B2 * | 1/2012 | Kawamura et al. | 324/551 |
| 8,198,902 | B2 * | 6/2012 | Kawamura | 324/551 |

(Continued)

OTHER PUBLICATIONS

Zhen-jun et al., "A Novel Insulation Resistance Monitoring Device for Hybrid Electric Vehicle", IEEE Vehicle Power and Propulsion Conference (VPPC), Sep. 3-5, 2008, p. 1-4.*

(Continued)

*Primary Examiner* — Patrick Assouad
*Assistant Examiner* — Lamarr Brown
(74) *Attorney, Agent, or Firm* — Marsh Fischmann & Breyfogle LLP (57) ABSTRACT

A measuring device for measuring insulation resistance of an electric vehicle includes a measuring unit, a voltage detecting unit, and a control unit. The measuring unit includes a first tap, a second tap, a switch, and a measuring resistor. The first tap is to be electrically coupled to a high potential side of a high voltage system. The second tap is to be electrically coupled to a ground side of a low voltage system. The switch and the measuring resistor are connected in series between the first tap and the second tap. The voltage detecting unit is for detecting a voltage formed between the first tap and the second tap. The control unit is operable for controlling ON and OFF states of the switch, and is configured to determine the high potential insulation resistance and the low potential insulation resistance after operating the switch in the ON and OFF states.

8 Claims, 5 Drawing Sheets

(56) References Cited

U.S. PATENT DOCUMENTS

| | | | |
|---|---|---|---|
| 8,466,691 B2* | 6/2013 | Hernando et al. | 324/551 |
| 8,552,733 B2* | 10/2013 | Park et al. | 324/509 |
| 2002/0175700 A1* | 11/2002 | Nagano et al. | 326/30 |
| 2003/0042909 A1* | 3/2003 | Yamamoto et al. | 324/522 |
| 2004/0130326 A1* | 7/2004 | Yamamoto | 324/503 |
| 2004/0189330 A1* | 9/2004 | Herb et al. | 324/691 |
| 2005/0073317 A1* | 4/2005 | Yamamoto et al. | 324/503 |
| 2005/0127921 A1* | 6/2005 | Sugiura | 324/522 |
| 2005/0231217 A1* | 10/2005 | Carruthers | 324/691 |
| 2006/0071618 A1* | 4/2006 | Yudahira et al. | 318/12 |
| 2006/0082376 A1* | 4/2006 | Allen et al. | 324/522 |
| 2007/0001684 A1* | 1/2007 | Kawamura | 324/522 |
| 2007/0132457 A1* | 6/2007 | Okamoto et al. | 324/522 |
| 2007/0285057 A1* | 12/2007 | Yano | 320/116 |
| 2010/0244850 A1* | 9/2010 | Yano et al. | 324/510 |
| 2010/0283773 A1* | 11/2010 | Kim | 345/211 |
| 2010/0308841 A1* | 12/2010 | Karrer et al. | 324/551 |
| 2011/0006777 A1* | 1/2011 | Park et al. | 324/509 |
| 2011/0181306 A1* | 7/2011 | Nalbant | 324/713 |
| 2012/0221269 A1* | 8/2012 | Wanner et al. | 702/65 |
| 2013/0176042 A1* | 7/2013 | Huh | 324/693 |

OTHER PUBLICATIONS

Li et al., "Research on Insulation Resistance On-Line Monitoring for Electric Vehicle", ICEMS 2005, p. 814-817.*

* cited by examiner

MEASURING DEVICE FOR MEASURING INSULATION RESISTANCE OF AN ELECTRIC VEHICLE

BACKGROUND OF THE INVENTION

1. Field of the Invention

The present invention relates to a measuring device, more particularly to a measuring device for measuring insulation resistance of an electric vehicle.

2. Description of the Related Art

Figure 1:
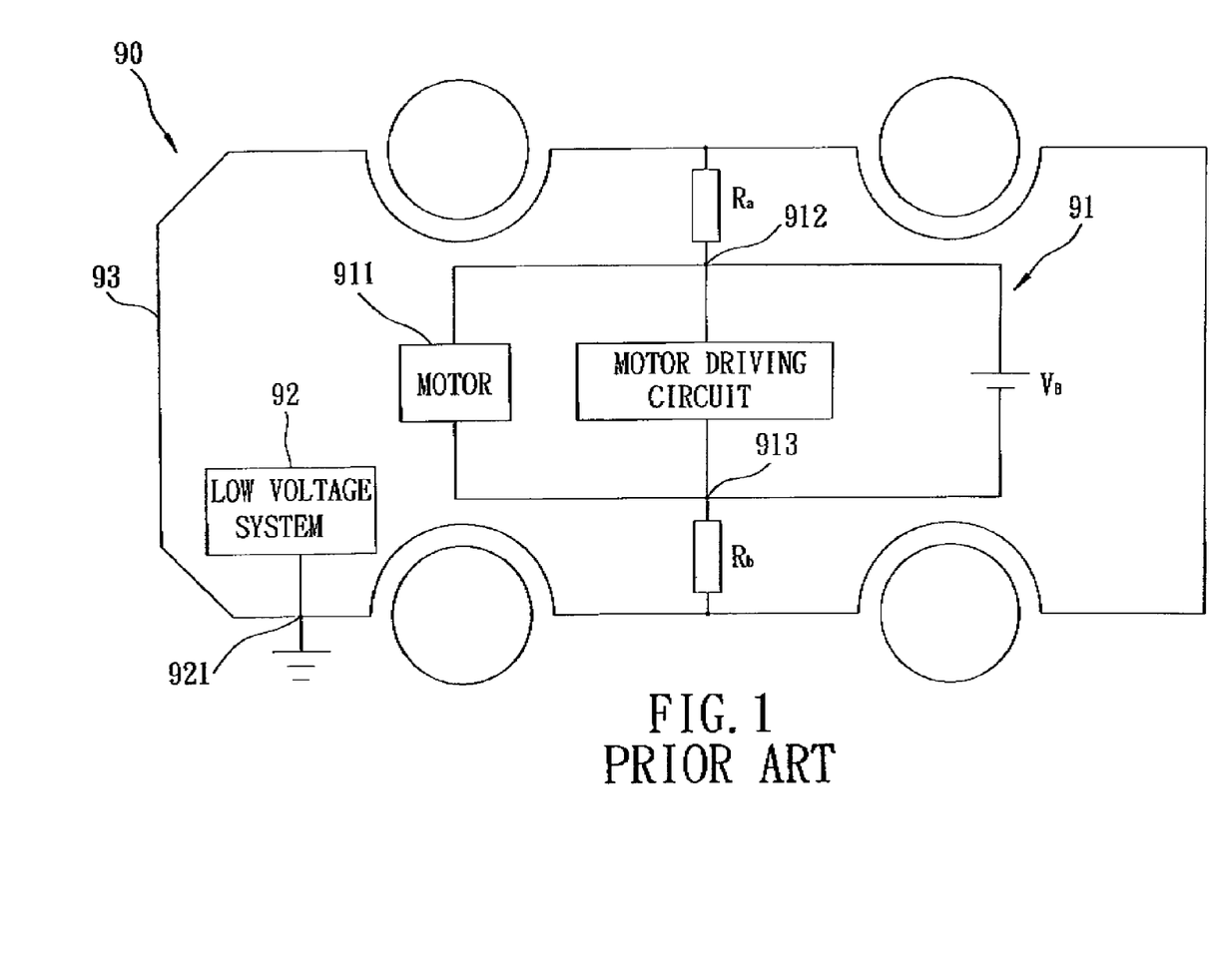
FIG. 1 is a schematic diagram illustrating a high voltage system and a low voltage system of a conventional electric vehicle.

Referring to FIG. 1, an electric vehicle 90 usually includes a high voltage system 91 and a low voltage system 92. The high voltage system 91 is primarily configured for driving a motor 911 and thus a high voltage power source $V_B$ is adopted for power supply. The low voltage system 92 is primarily configured for providing power for electric circuits generally operating at low voltages. A ground side 921 of the low voltage system 92 is electrically connected to a vehicle body 93 of the electric vehicle 90 so as to form a ground system. Since the high voltage system 91 is not connected to the vehicle body 93, the high voltage system 91 is electrically insulated from the low voltage system 92.

After assembly of the electric vehicle 90, a high potential insulation resistance $R_a$ is a resistance between a high potential side 912 of the high voltage system 91 and the vehicle body 93, and a low potential insulation resistance $R_b$ is a resistance between a low potential side 913 of the high voltage system 91 and the vehicle body 93. The high potential insulation resistance $R_a$ and the low potential insulation resistance $R_b$ are crucial in consideration of operational safety. If the high potential insulation resistance $R_a$ and the low potential insulation resistance $R_b$ are insufficient, electric leakage may occur, and operation of the high voltage system 91 and the low voltage system 92 may become unstable and the systems 91, 92 may be prone to damage.

Therefore, it is necessary to measure the high potential insulation resistance $R_a$ and the low potential insulation resistance $R_b$ for ensuring stability and safety of operation of the high voltage system 91 and the low voltage system 92. A leakage detection circuit for an electric vehicle is disclosed in U.S. Pat. No. 7,592,815. However, four resistors, two switches, and an inverter are required so as to form a detecting unit. Therefore, circuit complexity and manufacturing cost associated with implementation of the aforementioned patent are relatively high. Moreover, only a combined leakage resistance value may be derived from mathematical operations, and the high potential insulation resistance $R_a$ and the low potential insulation resistance $R_b$ may not be independently determined.

SUMMARY OF THE INVENTION

Therefore, an object of the present invention is to provide a measuring device for measuring insulation resistance of an electric vehicle that is relatively low in circuit complexity and manufacturing cost.

The electric vehicle includes a high voltage system and a low voltage system. A high potential insulation resistance is a resistance between a high potential side of the high voltage system and a ground side of the low voltage system. A low potential insulation resistance is a resistance between a low potential side of the high voltage system and the ground side of the low voltage system.

Accordingly, the measuring device for measuring insulation resistance of an electric vehicle of the present invention includes a measuring unit, a voltage detecting unit, and a control unit.

The measuring unit includes a first tap, a second tap, a switch, and a measuring resistor. The first tap is to be electrically coupled to the high potential side of the high voltage system. The second tap is to be electrically coupled to the ground side of the low voltage system. The switch and the measuring resistor are connected in series between the first tap and the second tap.

The voltage detecting unit is for detecting a voltage formed between the first tap and the second tap.

The control unit is coupled to the switch and the voltage detecting unit. The control unit includes a control module that is operable for controlling ON and OFF states of the switch, and that stores a highest voltage value of the high potential side, a resistance value of the measuring resistor, a first function, and a second function.

Accordingly, the control module acquires a first voltage via the voltage detecting unit when the switch is in the OFF state, and acquires a second voltage via the voltage detecting unit when the switch is in the ON state. Each of the first voltage and the second voltage is related to the voltage between the first tap and the second tap.

Moreover, each of the first function and the second function is a function of the highest voltage value, the first voltage, and the second voltage. The control module is configured to determine the high potential insulation resistance from a product of the resistance value of the measuring resistor and the first function, and to determine the low potential insulation resistance from a product of the resistance value of the measuring resistor and the second function.

BRIEF DESCRIPTION OF THE DRAWINGS

Other features and advantages of the present invention will become apparent in the following detailed description of the two preferred embodiments with reference to the accompanying drawings, of which.

DETAILED DESCRIPTION OF THE PREFERRED EMBODIMENTS

Before the present invention is described in greater detail with reference to the preferred embodiments, it should be noted that the same reference numerals are used to denote the same elements throughout the following description.

Figure 2:
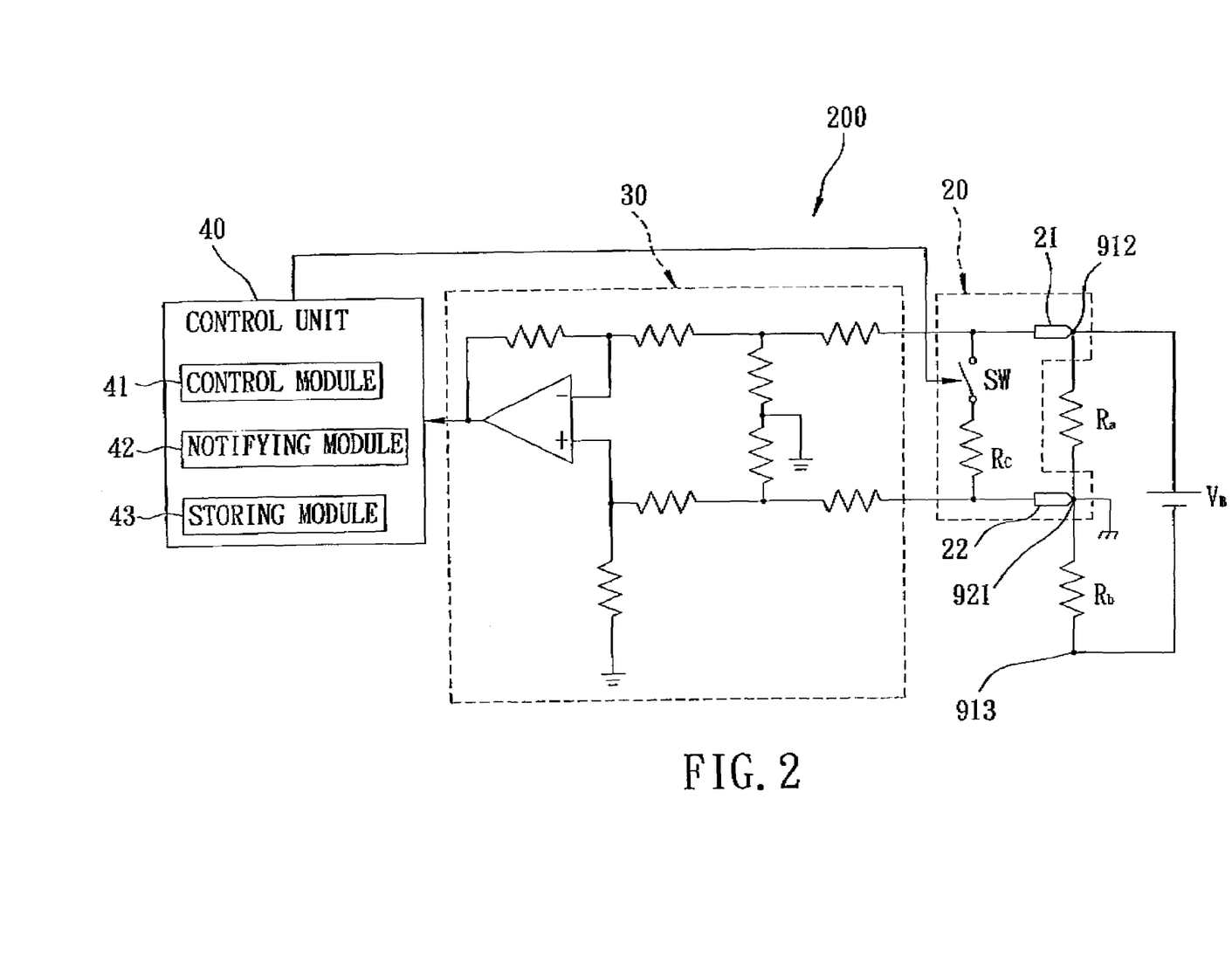
FIG. 2 is a schematic circuit diagram illustrating a first preferred embodiment of a measuring device for measuring insulation resistance of an electric vehicle of the present invention.

Referring to FIG. 1 and FIG. 2, a first preferred embodiment of a measuring device 200 for measuring insulation resistance of an electric vehicle 90 of the present invention is illustrated. The electric vehicle 90 includes a high voltage system 91 and a low voltage system 92. A high potential insulation resistance $R_a$ is a resistance between a high potential side 912 of the high voltage system 91 and a ground side 921 of the low voltage system 92. A low potential insulation resistance $R_b$ is a resistance between a low potential side 913 of the high voltage system 91 and the ground side 921 of the low voltage system 92. In this embodiment, the ground side 921 is electrically coupled to a vehicle body 93 of the electric vehicle 90.

The measuring device 200 for measuring insulation resistance includes a measuring unit 20, a voltage detecting unit 30, and a control unit 40.

The measuring unit 20 includes a first tap 21, a second tap 22, a switch (SW), and a measuring resistor $R_c$.

The first tap 21 is to be electrically coupled to the high potential side 912 of the high voltage system 91.

The second tap 22 is to be electrically coupled to the ground side 921 of the low voltage system 92. Since the ground side 921 is electrically coupled to the vehicle body 93 in this embodiment, the second tap 22 may be brought to contact with the vehicle body 93 directly so as to form electrical coupling to the ground side 921.

The switch (SW) and the measuring resistor $R_c$ are connected in series between the first tap 21 and the second tap 22.

The voltage detecting unit 30 is for detecting a voltage formed between the first tap and the second tap. In this embodiment, an operational amplifier circuit is adopted as the voltage detecting unit 30.

The control unit 40 is coupled to the switch (SW) and the voltage detecting unit 30. The control unit 40 includes a control module 41, a notifying module 42, and a storing module 43.

The control module 41 is operable for controlling ON and OFF states of the switch (SW), and stores a highest voltage value $V_B$ of the high potential side 912, a resistance value of the measuring resistor $R_e$, a first function, a second function, a first safety threshold, and a second safety threshold.

Figure 3:
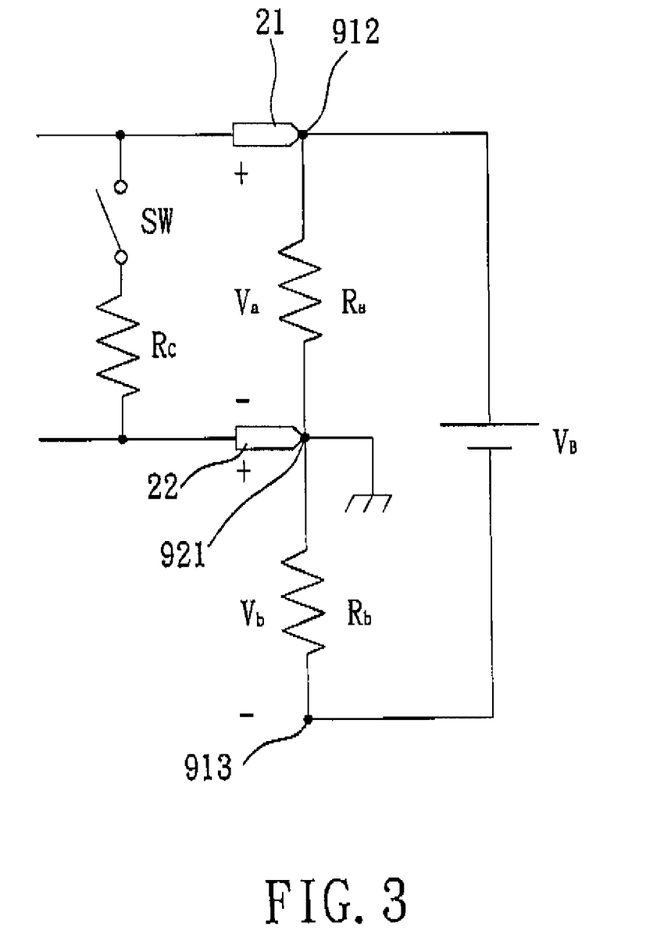
FIG. 3 is a circuit diagram illustrating a measuring unit of the first preferred embodiment when a switch is in an OFF state.
Figure 4:
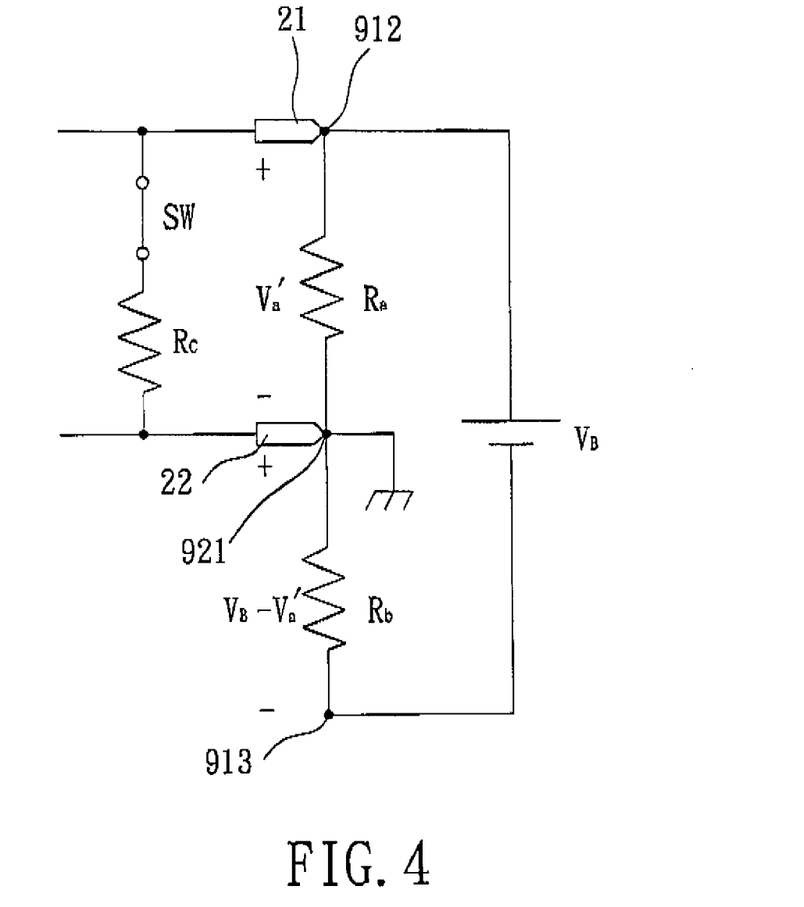
FIG. 4 is a circuit diagram illustrating the measuring unit of the first preferred embodiment when the switch is in an ON state.

The control module 41 acquires a first voltage $V_a$ via the voltage detecting unit 30 when the switch (SW) is in the OFF state (see FIG. 3), and acquires a second voltage $V_a'$ via the voltage detecting unit 30 when the switch (SW) is in the ON state (see FIG. 4). Each of the first voltage $V_a$ and the second voltage $V_a'$ is related to the voltage between the first tap 21 and the second tap 22.

Furthermore, each of the first function and the second function is a function of the highest voltage value $V_B$, the first voltage $V_a$ and the second voltage $V_a'$. The control module 41 is configured to determine the high potential insulation resistance $R_a$ from a product of the resistance value of the measuring resistor $R_c$ and the first function, and to determine the low potential insulation resistance $R_b$ from a product of the resistance value of the measuring resistor $R_c$ and the second function.

Referring to FIG. 1 to FIG. 4, mathematical operations for determining the high potential insulation resistance $R_a$ and the low potential insulation resistance $R_b$ are illustrated hereinafter:

When the switch (SW) is in the OFF state (referring to FIG. 3), Equation 1 may be derived from circuit analysis:

$$\frac{V_a}{R_a} = \frac{V_b}{R_b}, \qquad \text{Equation 1}$$

in which, $V_b = V_B - V_a$.

When the switch (SW) is in the ON state (referring to FIG. 4), Equation 2 may be derived from circuit analysis:

$$\frac{V_a'}{R_a} + \frac{V_a'}{R_c} = \frac{V_B - V_a'}{R_b}, \qquad \text{Equation 2}$$

It may be derived from Equation 1 and Equation 2 that:

$$R_a = R_c\left(1 + \frac{V_a}{V_B - V_a}\right)\left(\frac{V_a - V_a'}{V_a'}\right),$$

and $$R_b = R_c\left(1 + \frac{V_B - V_a}{V_a}\right)\left(\frac{V_a - V_a'}{V_a'}\right),$$

in which, the first function is $$\left(1 + \frac{V_a}{V_B - V_a}\right)\left(\frac{V_a - V_a'}{V_a'}\right),$$

and the second function is $$\left(1 + \frac{V_B - V_a}{V_a}\right)\left(\frac{V_a - V_a'}{V_a'}\right).$$

Since the highest voltage value $V_B$ of the high potential side 912 is predetermined during design of power supply for the motor 911, since the resistance value of the measuring resistor $R_c$ is also predetermined, and since each of the first voltage $V_a$ and the second voltage $V_a'$ may be acquired via the voltage detecting unit 30, the control module 41 is capable of determining the high potential insulation resistance $R_a$ and the low potential insulation resistance $R_b$.

The high potential insulation resistance $R_a$ and the low potential insulation resistance $R_b$ may be stored in the storing module 43. Preferably, the control module 41 is configured to enable output of a notifying signal, such as an audible signal or a visible signal, via the notifying module 42 so as to notify users that the high potential insulation resistance $R_a$ or the low potential insulation resistance $R_b$ is insufficient when the high potential insulation resistance $R_a$ is determined to be smaller than the first safety threshold or when the low potential insulation resistance $R_b$ is determined to be smaller than the second safety threshold.

In this way, since circuit complexity of the measuring unit 20 is relatively low and only the switch (SW) and the measuring resistor $R_c$ are required without other switches or additional resistors, cost of manufacturing is relatively low. Moreover, the control module 41 is capable of determining the high potential insulation resistance $R_a$ and the low potential insulation resistance $R_b$, which have great values for manufacturers when evaluating insulation performance and overcoming electrical leakage. Therefore, electric vehicles may achieve good and stable qualities.

Figure 5:
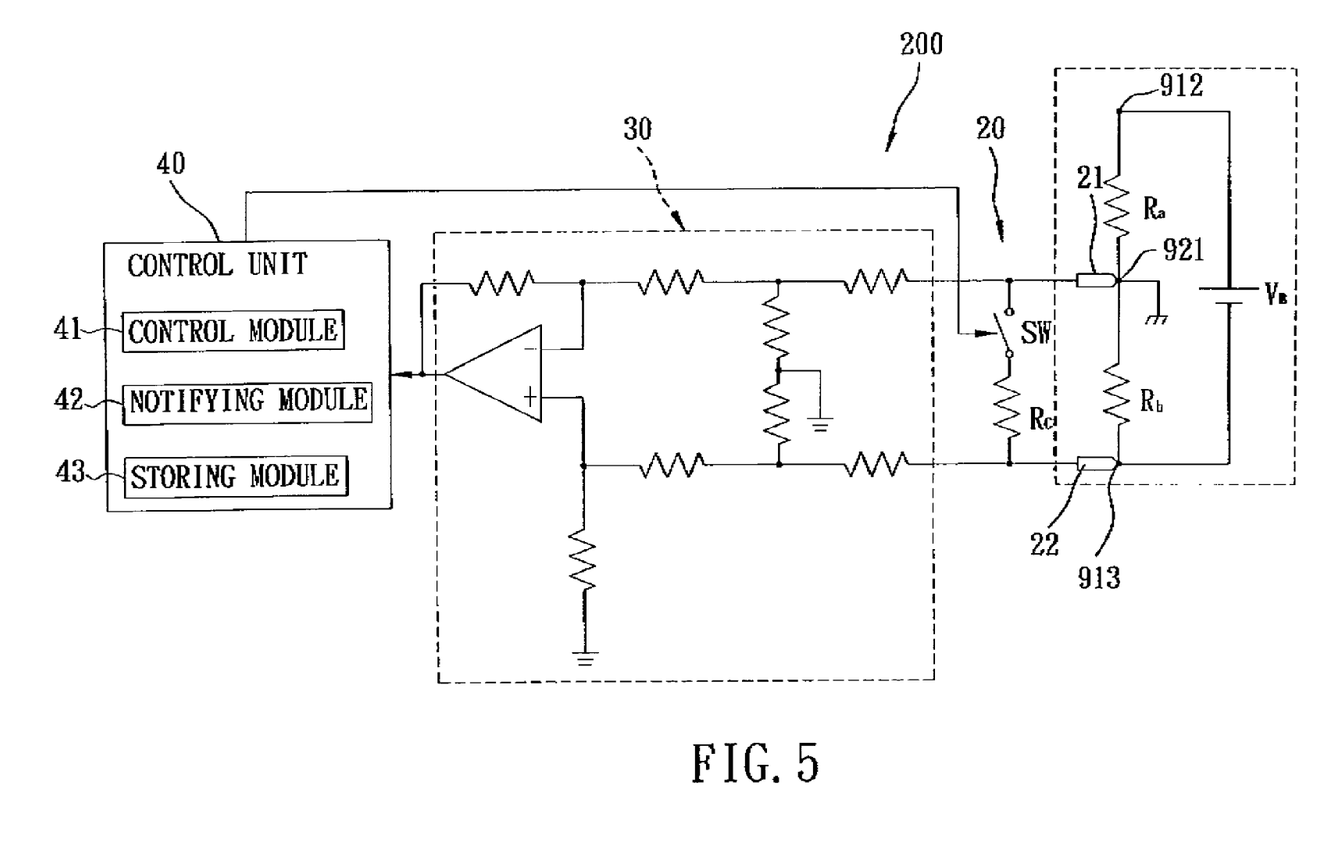
FIG. 5 is a schematic circuit diagram illustrating a second preferred embodiment of the measuring device for measuring insulation resistance of an electric vehicle of the present invention.

Referring to FIG. 1 and FIG. 5, a second preferred embodiment of the measuring device 200 is illustrated. This embodiment differs from the previous embodiment in that:

The first tap 21 is to be electrically coupled to the ground side 921 of the low voltage system 92 or the vehicle body 93.

The second tap 22 is to be electrically coupled to the low potential side 913 of the high voltage system 91. The control module 41 acquires a first voltage $V_b$ via the voltage detecting unit 30 when the switch (SW) is in the OFF state, and acquires a second voltage $V_b'$ via the voltage detecting unit 30 when the switch is in the ON state. Each of the first voltage $V_b$ and the second voltage $V_b'$ is related to the voltage between the first tap 21 and the second tap 22.

In this way, the high potential insulation resistance $R_a$ and the low potential insulation resistance $R_b$ may be derived according to the following equations:

$$R_a = R_c\left(1 + \frac{V_b}{V_B - V_b}\right)\left(\frac{V_b - V_b'}{V_b'}\right),$$

and $$R_b = R_c\left(1 + \frac{V_B - V_b}{V_b}\right)\left(\frac{V_b' - V_b'}{V_b'}\right),$$

in which, the first function is $$\left(1 + \frac{V_b}{V_B - V_b}\right)\left(\frac{V_b - V_b'}{V_b'}\right),$$

and the second function is $$\left(1 + \frac{V_B - V_b}{V_b}\right)\left(\frac{V_b - V_b'}{V_b'}\right).$$

Thus, the control module 41 is capable of determining the high potential insulation resistance $R_a$ and the low potential insulation resistance $R_b$ in a manner similar to the previous embodiment.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A measuring device for measuring insulation resistance of an electric vehicle, the electric vehicle including a high voltage system and a low voltage system, a high potential insulation resistance being a resistance between a high potential side of the high voltage system and a ground side of the low voltage system, a low potential insulation resistance being a resistance between a low potential side of the high voltage system and the ground side of the low voltage system, said measuring device comprising:

a measuring unit including a first tap, a second tap, a switch, and a measuring resistor, said first tap to be electrically coupled to the high potential side of the high voltage system, said second tap to be electrically coupled to the ground side of the low voltage system, said switch and said measuring resistor being connected in series between said first tap and said second tap;

a voltage detecting unit, for detecting a voltage formed between said first tap and said second tap; and a control unit coupled to said switch and said voltage detecting unit, said control unit including a control module that is operable for controlling ON and OFF states of said switch, and that stores a highest voltage value of the high potential side, a resistance value of said measuring resistor, a first function, and a second function, wherein:

said control module acquires a first voltage via said voltage detecting unit when said switch is in the OFF state, and acquires a second voltage via said voltage detecting unit when said switch is in the ON state;

each of the first voltage and the second voltage is related to the voltage between said first tap and said second tap;

each of said first function and said second function is a function of the highest voltage value, the first voltage, and the second voltage; and said control module is configured to determine the high potential insulation resistance from a product of the resistance value of said measuring resistor and said first function, and to determine the low potential insulation resistance from a product of the resistance value of said measuring resistor and said second function.

2. The measuring device as claimed in claim 1, wherein said control unit further includes a notifying module, said control module further storing a first safety threshold and a second safety threshold, said control module being configured to enable output of a notifying signal via said notifying module when the high potential insulation resistance is determined to be smaller than said first safety threshold or when the low potential insulation resistance is determined to be smaller than said second safety threshold.

3. The measuring device as claimed in claim 1, wherein said control unit further includes a storing module for storing the high potential insulation resistance and the low potential insulation resistance determined by said control module.

4. The measuring device as claimed in claim 1, wherein said first function is $$\left(1 + \frac{V_a}{V_B - V_a}\right)\left(\frac{V_a - V_a'}{V_a'}\right),$$

and said second function is $$\left(1 + \frac{V_B - V_a}{V_a}\right)\left(\frac{V_a - V_a'}{V_a'}\right),$$

in which $V_B$ represents the highest voltage value of the high potential side, $V_a$ represents the first voltage, and $V_a'$ represents the second voltage.

5. A measuring device for measuring insulation resistance of an electric vehicle, the electric vehicle including a high voltage system and a low voltage system, a high potential insulation resistance being a resistance between a high potential side of the high voltage system and a ground side of the low voltage system, a low potential insulation resistance being a resistance between a low potential side of the high voltage system and the ground side of the low voltage system, said measuring device comprising:

a measuring unit including a first tap, a second tap, a switch, and a measuring resistor, said first tap to be electrically coupled to the ground side of the low voltage system, said second tap to be electrically coupled to the low potential side of the high voltage system, said switch and said measuring resistor being connected in series between said first tap and said second tap;

a voltage detecting unit for detecting a voltage formed between said first tap and said second tap; and a control unit coupled to said switch and said voltage detecting unit, said control unit including a control module that is operable for controlling ON and OFF states of said switch, and that stores a highest voltage value of the high potential side, a resistance value of said measuring resistor, a first function, and a second function, wherein:

said control module acquires a first voltage via said voltage detecting unit when said switch is in the OFF state, and acquires a second voltage via said voltage detecting unit when said switch is in the ON state;

each of the first voltage and the second voltage is related to the voltage between said first tap and said second tap;

each of said first function and said second function is a function of the highest voltage value, the first voltage, and the second voltage; and said control module is configured to determine the high potential insulation resistance from a product of the resistance value of said measuring resistor and said first function, and to determine the low potential insulation resistance from a product of the resistance value of said measuring resistor and said second function.

6. The measuring device as claimed in claim 5, wherein said control unit further includes a notifying module, said control module further storing a first safety threshold and a second safety threshold, said control module being configured to enable output of a notifying signal via said notifying module when the high potential insulation resistance is determined to be smaller than said first safety threshold or when the low potential insulation resistance is determined to be smaller than said second safety threshold.

7. The measuring device as claimed in claim 5, wherein said control unit further includes a storing module for storing the high potential insulation resistance and the low potential insulation resistance determined by said control module.

8. The measuring device as claimed in claim 5, wherein said first function is $$\left(1 + \frac{V_b}{V_B - V_b}\right)\left(\frac{V_b - V_b'}{V_b'}\right),$$

and said second function is $$\left(1 + \frac{V_B - V_b}{V_b}\right)\left(\frac{V_b - V_b'}{V_b'}\right),$$

in which $V_B$ represents the highest voltage value of the high potential side, $V_b$ represents the first voltage, and $V_b'$ represents the second voltage.

* * * * *